(12) United States Patent
Yin et al.

(10) Patent No.: US 12,131,107 B2
(45) Date of Patent: Oct. 29, 2024

(54) DEVICE AND METHOD FOR EARLY MONITORING OF GAS INTRUSION BASED ON PRESSURE WAVE PROPAGATION

(71) Applicant: CHINA UNIVERSITY OF PETROLEUM (EAST CHINA), Dongying (CN)

(72) Inventors: Bangtang Yin, Dongying (CN); Yuhang Pang, Dongying (CN); Tianbao Ding, Dongying (CN); Baojiang Sun, Dongying (CN); Zhiyuan Wang, Dongying (CN); Shujie Liu, Dongying (CN); Zhiming Yin, Dongying (CN); Meipeng Ren, Dongying (CN)

(73) Assignee: CHINA UNIVERSITY OF PETROLEUM (EAST CHINA), Dongying (CN)

( * ) Notice: Subject to any disclaimer, the term of this patent is extended or adjusted under 35 U.S.C. 154(b) by 0 days.

(21) Appl. No.: 18/622,220

(22) Filed: Mar. 29, 2024

(65) Prior Publication Data

US 2024/0242011 A1    Jul. 18, 2024

(30) Foreign Application Priority Data

May 10, 2023    (CN) .......................... 202310523100.1

(51) Int. Cl.
*G01F 1/42*    (2006.01)
*G01F 15/00*    (2006.01)
*G06F 30/28*    (2020.01)

(52) U.S. Cl.
CPC ................ *G06F 30/28* (2020.01); *G01F 1/42* (2013.01); *G01F 15/005* (2013.01)

(58) Field of Classification Search
CPC ................................. G01F 1/42; G01F 15/005
See application file for complete search history.

(56) References Cited

U.S. PATENT DOCUMENTS

2023/0296002 A1*    9/2023    Yin .......................... E21B 41/00
73/152.01

FOREIGN PATENT DOCUMENTS

| CA | 2585286 A1 | 4/2001 |
|---|---|---|
| CN | 1676928 A | 10/2005 |
| CN | 104074506 A | 10/2014 |
| CN | 106801602 A | 6/2017 |
| CN | 107060737 A | 8/2017 |

(Continued)

*Primary Examiner* — Alexander A Mercado
*Assistant Examiner* — Rodney T Frank

(57) ABSTRACT

A device and a method for early monitoring of gas intrusion based on pressure wave propagation are provided in the present disclosure. The technical solution is as follows. The lower end of the liquid storage tank is connected to the simulated wellbore through a liquid injection pipeline, a centrifugal pump, a pressure-stabilizing water tank, and a mass flowmeter. One end of the gas storage tank is connected to a screw air compressor, while the other end is connected to the simulated wellbore through an injection pipeline and a micro-orifice flowmeter. The gas-liquid mixer is provided at the upper end of the simulated wellbore, with the pressure-disturbing device connected below it. Multiple pressure sensors are provided at the middle of the simulated wellbore and connected to the computer via wires and an oscilloscope.

9 Claims, 3 Drawing Sheets

(56) References Cited

FOREIGN PATENT DOCUMENTS

| CN | 108119128 A | 6/2018 |
| CN | 113323653 A | 8/2021 |
| CN | 114046143 A | 2/2022 |

* cited by examiner

DEVICE AND METHOD FOR EARLY MONITORING OF GAS INTRUSION BASED ON PRESSURE WAVE PROPAGATION

CROSS-REFERENCE TO RELATED APPLICATIONS

This application claims the benefit of priority from Chinese Patent Application No. 202310523100.1, filed on May 10, 2023. The content of the aforementioned application, including any intervening amendments made thereto, is incorporated herein by reference in its entirety.

TECHNICAL FIELD

This application relates to a drilling well control experimental technology, and more particularly to a device and method for early monitoring of gas intrusion based on pressure wave propagation.

BACKGROUND

With the continuous increase in drilling depth and the continuous improvement of drilling technology, a growing number of deep and ultra-deep wells are developed in various exploration areas. Due to geological changes, drilling operation issues, and some other reasons, downhole gas intrusion may occur. Because gas intrusion accidents are frequent and severe, they often lead to various underground accidents affecting average production, and in severe cases, they may endanger personal safety. Therefore, we should pay more attention to the prevention and control of gas intrusion and take corresponding measures to prevent and control gas intrusion.

Gas intrusion is generally a hidden and sudden occurrence that can be difficult to manage. One typical method for monitoring gas intrusion involves detecting differences in the density of fluids at the inlet and outlet to determine the type of gas intrusion. However, in practical production, collecting and accurately pinpointing various data is challenging, making early detection for downhole gas intrusion difficult. Currently, in many operating oilfields, workers rely heavily on visual observations to judge whether gas intrusion has occurred, increasing their workload and work complexity. Additionally, it is often difficult to achieve timely diagnosis and treatment after a gas intrusion accident occurs.

SUMMARY

The purpose of the present disclosure is to address the aforementioned limitations of prior art by providing an experimental method and an experiment device for early monitoring gas intrusion based on a pressure wave method. By monitoring variations of the fluctuation of pressure wave within the simulated wellbore, critical parameters for simulating an abnormal pressure fluctuation signal during the gas intrusion in the simulated wellbore can be identified, which provides a theoretical basis for the early detection and control of the gas intrusion, ensuring the safety of the drilling operation.

This application provides a device for early monitoring of gas intrusion based on pressure wave propagation, including a liquid storage tank, a gas storage tank, a simulated wellbore, a computer, a centrifugal pump, a pressure-stabilizing water tank, a mass flowmeter, a screw air compressor, a micro-orifice flowmeter, a gas-liquid mixer, a pressure-disturbing device, a gas-liquid separator, and an oscilloscope; wherein a lower end of the liquid storage tank is connected to an inlet end of the pressure-stabilizing water tank through a first liquid-injection pipeline and the centrifugal pump. An outlet end of the pressure-stabilizing water tank is connected to a liquid inlet of the gas-liquid mixer through a second liquid-injection pipeline and the mass flowmeter. A first end of the gas storage tank is connected to the screw air compressor, and a second end of the gas storage tank is connected to a gas inlet of the gas-liquid mixer through a gas-injection pipeline and the micro-orifice flowmeter. The gas-liquid mixer is provided at an upper end of the simulated wellbore. the pressure-disturbing device is connected to a lower side of the gas-liquid mixer. A plurality of pressure sensors are provided at a middle of the simulated wellbore, and connected to the computer through a wire and the oscilloscope. The gas-liquid separator is connected to a lower end of the simulated wellbore, and a liquid outlet of the gas-liquid separator is in pipeline connection with the liquid storage tank for recycling.

In some embodiments, the pressure-disturbing device includes a pressure wave generator, a pressure wave propagation unit, and a disturbance tube. The pressure wave generator is provided with one or more pistons. A lower outlet of each of the one or more pistons is connected to a collection chamber. An outlet end of the collection chamber communicates with the pressure wave propagation unit. An outer wall of the disturbance tube is provided with a plurality of openings. The plurality of openings are each provided with a rubber membrane. An outer end of the pressure wave propagation unit is connected to the disturbance tube. The rubber membrane is configured to collect and concentrate pressure waves for propagation.

In some embodiments, a first side of the pressure wave propagation unit is a cylindrical structure, and a second side of the pressure wave propagation unit is a spherical-like structure; and an outer end of the spherical-like structure is connected to the disturbance tube.

In some embodiments, a first regulating valve, a first ball valve, a first pressure measurement point and a first temperature measurement point are sequentially provided on the second liquid-injection pipeline; the number of the mass flowmeter is one or more, and one or more mass flowmeters are provided on a first side of the first temperature measurement point; a first end of each of the one or more mass flowmeters is connected to a first micro-regulating valve, and a second end of each of the one or more mass flowmeters is connected to a second micro-regulating valve; and the first regulating valve, the first ball valve, the first micro-regulating valve and the second micro-regulating valve are configured to be adjusted in terms of opening degree to control liquid flow and pressure input into the simulated wellbore.

In some embodiments, a second regulating valve, a second ball valve, a second pressure measurement point and a second temperature measurement point are sequentially provided on the gas-injection pipeline; the number of the micro-orifice flowmeter is one or more, and one or more micro-orifice flowmeters are provided on a side of the second temperature measurement point away from the gas storage tank; a third pressure measurement point is provided on a first side of each of the one or more micro-orifice flowmeters; and a third micro-regulating valve is provided on a second side of each of the one or more micro-orifice flowmeters; and the second regulating valve, the second ball valve and the third micro-regulating valve are configured to be adjusted in terms of opening degree to adjust a void fraction and a pressure disturbance frequency, so as to simulate effects of different parameters on a propagation pattern of the pressure waves inside a wellbore.

In some embodiments, the simulated wellbore comprises an outer pipe and an inner pipe; and the outer pipe and the inner pipe are both made of a transparent acrylic glass.

In some embodiments, the plurality of pressure sensors are arranged at intervals of 0.5 m on an outer side of the simulated wellbore; and the plurality of pressure sensors are connected to the oscilloscope through an optical fiber to transmit a pressure signal to the oscilloscope.

In some embodiments, an angular frequency of the pressure waves generated by the pressure-disturbing device ranges from 0 to 314 Hz.

In some embodiments, an expansion tube is provided at the lower end of the simulated wellbore; and the expansion tube is configured to eliminate reflection of the pressure waves to improve measurement accuracy of the pressure signal.

This application also provides a method for early monitoring of gas intrusion based on pressure wave propagation, including the following steps.

(S1) A shut-off valve on the first liquid-injection pipeline is opened, and the centrifugal pump to pressurize water is turned on, such that the first liquid-injection pipeline is filled with water.

The water is allowed to flow sequentially through the first regulating valve, the first ball valve, the first pressure measurement point, the first temperature measurement point, the first micro-regulating valve, the mass flowmeter, the second micro-regulating valve, and a check valve into the liquid inlet of the gas-liquid mixer.

The water is allowed to flow through an outlet of the gas-liquid mixer to enter the simulated wellbore to flow downwards along the inner pipe; wherein the plurality of pressure sensors are arranged at intervals of 0.5 m on the outer side of the simulated wellbore, and connected to the oscilloscope through the optical fiber to transmit the pressure signal to the oscilloscope and the computer.

(S2) After a flow pattern in the second liquid-injection pipeline and a pressure reading on the computer tends to be stable, the screw air compressor is turned on, and the gas storage tank connected to the screw air compressor, and the second regulating valve are opened, such that gas flows sequentially through the second regulating valve, the second ball valve, the second pressure measurement point and the second temperature measurement point on the gas-injection pipeline.

A pressure of the gas to be larger than a pressure within the second liquid-injection pipeline is adjusted by the one or more micro-orifice flowmeters.

The gas is allowed to enter the gas-liquid mixer through the gas inlet and flow into the inner pipe of the simulated wellbore to simulate gas intrusion.

An opening degree of the second ball valve is adjusted to change a void fraction of a fluid within the simulated wellbore, so as to simulate the gas intrusion under various formation conditions.

(S3) Pressure changes from the computer is read and readings of the mass flowmeter and the one or more micro-orifice flowmeters are obtained.

The water is allowed to flow through the expansion tube to eliminate a reflection of the pressure waves and flow downward to the gas-liquid separator.

The water is separated from the gas and ascends through an annulus formed between the outer pipe and the inner pipe and exits through an outlet of the annulus at a top of the simulated wellbore to enter the liquid storage tank for recycling.

The gas separated by the gas-liquid separator is directly discharged.

(S4) A disturbance angular frequency of the pressure-disturbing device is adjusted to simulate an effect of different parameters of the wellbore on a propagation pattern of the pressure waves in a wellbore, wherein the disturbance angular frequency is continuously adjustable within 0-314 Hz.

A pressure fluctuation inside the simulated wellbore is monitored to obtain a critical parameter associated with an abnormal pressure fluctuation signal when the simulated wellbore experiences gas intrusion, which provides a theoretical basis for an early detection and control of the gas intrusion to ensure safety of a drilling operation.

(S5) A viscosity of the water in the liquid storage tank is altered and repeating steps S1-S4 to simulate a condition of gas intrusion under different viscosity conditions of a drilling fluid, so as to provide a reference basis for investigation of the two-phase flow pattern and a two-phase pressure propagation pattern under the occurrence of an actual gas intrusion.

Compared to prior art, the present disclosure has the following beneficial effects.

On the one hand, the technical solution of the present disclosure is capable of simulating the propagation pattern of pressure waves within the wellbore under different types of gas intrusion and various parameter conditions. By altering disturbance frequency, void fraction, and viscosity of the water, reliable theoretical data can be provided for gas invasion incidents in vertical wellbores. This enables the development of reliable solutions.

On the other hand, with simple structure, the assembly of the device is flexible. Further, it supports for customizable installation distances of pressure sensors. The simulated wellbore adopts pipes made of transparent acrylic glass, and the angular frequency of the generated pressure waves is continuously adjustable within the range of 0 to 314 Hz. Multiple pressure sensors are arranged at intervals of 0.5 m on the outer side of the simulated wellbore. At the outlet of the experimental section, an expansion tube with a drastically increased diameter is used to eliminate the reflection of pressure waves, thereby further enhancing the accuracy of the measured pressure signals.

In the figures: 1—liquid storage tank, 2—shut-off valve, 3—centrifugal pump, 4—pressure-stabilizing water tank, 5—third regulating valve, 6—first regulating valve, 7—first ball valve, 8—first pressure measurement point, 9—first temperature measurement point, 10—first micro-regulating valve, 11—mass flowmeter, 12—second micro-regulating valve, 13—first check valve, 14—screw air compressor, 15—gas storage tank, 16—second regulating valve, 17—second ball valve, 18—second pressure measurement point, 19—second temperature measurement point, 20—third pressure measurement point, 21—micro-orifice flowmeters, 22—third micro-regulating valve, 23—second check valve, 24—gas-liquid mixer, 25—pressure-disturbing device, 26—simulated wellbore, 27—gas-liquid separator, 28—first pressure sensor, 29—second pressure sensor, 30—third pressure sensor, 31—fourth pressure sensor, 32—fifth pressure sensor, 33—sixth pressure sensor, 34—oscilloscope, 35—computer, 36—expansion tube, 25.1—pressure wave generator, 25.2—pressure wave propagation unit, 25.3—disturbance tube, 25.4—piston, 25.5—rubber membrane, 25.6—actuator, 25.7—heat dissipation and noise reduction plate, 25.8—collection chamber.

DETAILED DESCRIPTION OF EMBODIMENTS

The preferred embodiments of the present disclosure are illustrated with reference to the accompanying drawings. It should be understood that the preferred embodiments described here are for the purpose of illustration and explanation of the present disclosure and are not intended to limit the scope of the present disclosure.

Figure 1:
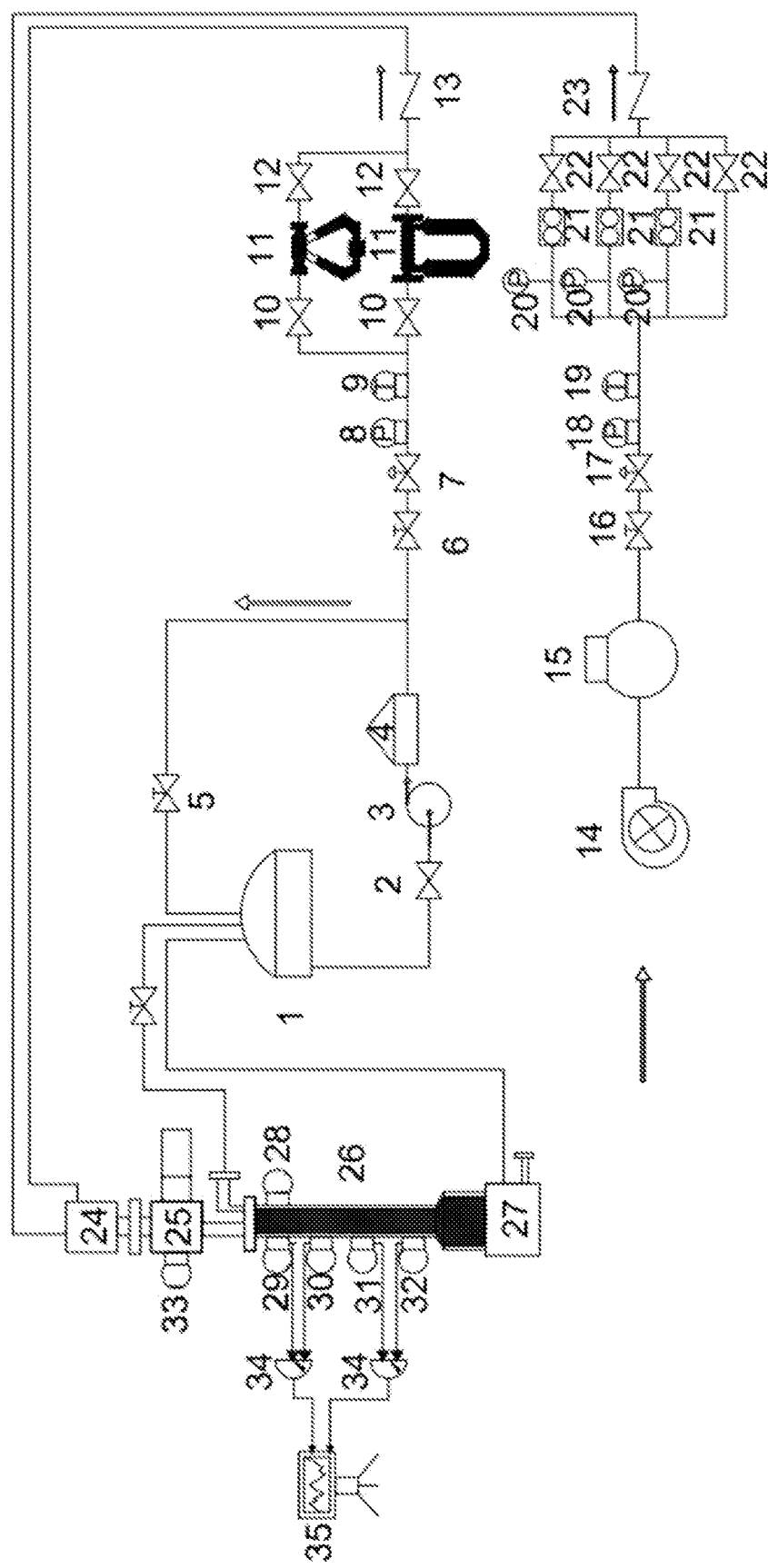
FIG. 1 is a schematic diagram of a device for early monitoring of gas intrusion according to an embodiment of this present disclosure.
Figure 2:
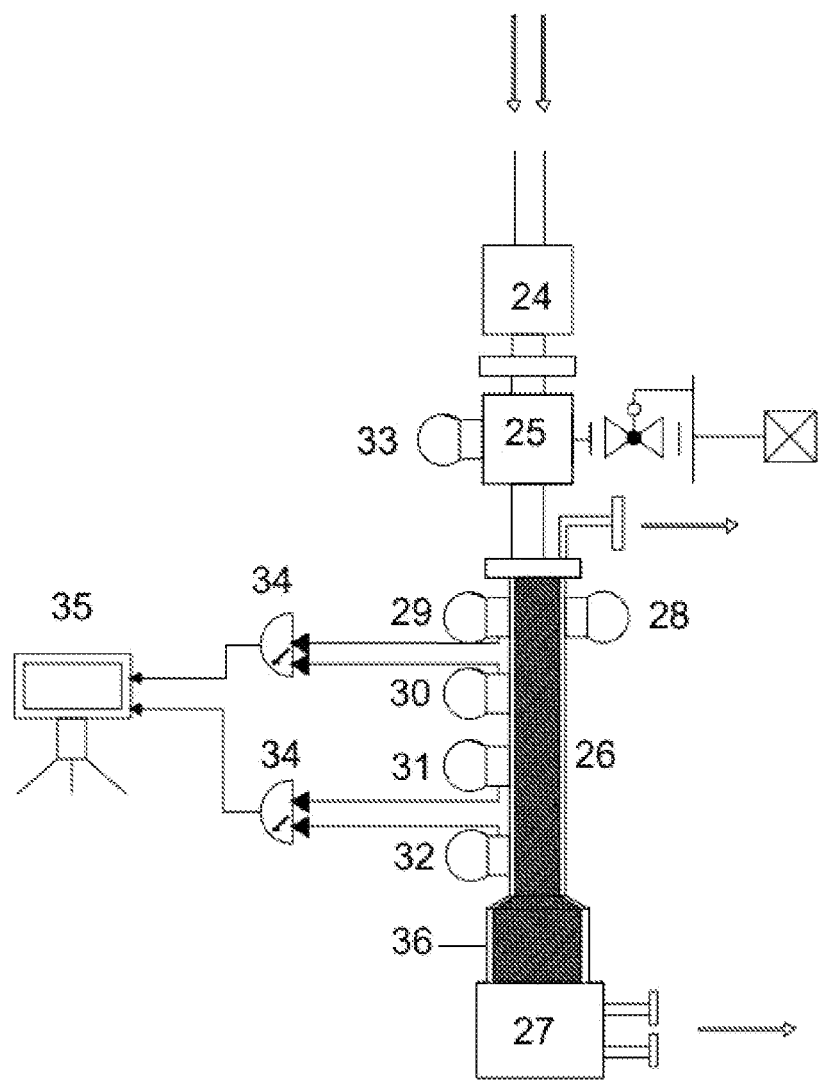
FIG. 2 is an enlarged view of a simulated wellbore according to an embodiment of this present disclosure.
Figure 3:
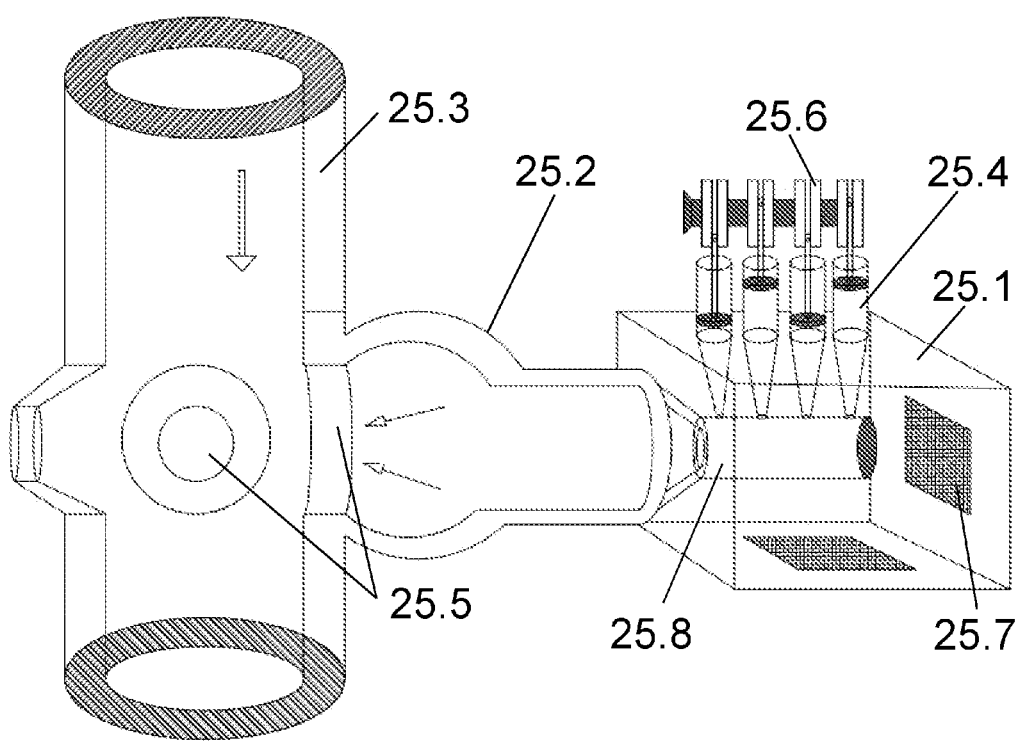
FIG. 3 is a schematic diagram of the structure of a pressure-disturbing device an embodiment of this present disclosure.

The first embodiment is shown in FIGS. 1-3. The embodiment provides a device for early monitoring of gas intrusion based on pressure wave propagation. The device for early monitoring of gas intrusion based on pressure wave propagation includes a liquid storage tank 1, a gas storage tank 15, a simulated wellbore 26, a computer 35, a centrifugal pump 3, a pressure-stabilizing water tank 4, a mass flowmeter 11, a screw air compressor 14, a micro-orifice flowmeter 21, a gas-liquid mixer 24, a pressure-disturbing device 25, a gas-liquid separator 27, and an oscilloscope 34. Specifically, a lower end of the liquid storage tank 1 is connected to an inlet end of the pressure-stabilizing water tank 4 through a first liquid-injection pipeline and the centrifugal pump 3. An outlet end of the pressure-stabilizing water tank 4 is connected to a liquid inlet of the gas-liquid mixer 24 through a second liquid-injection pipeline and the mass flowmeter 11. A first end of the gas storage tank 15 is connected to the screw air compressor 14, and a second end of the gas storage tank 15 is connected to a gas inlet of the gas-liquid mixer 24 through a gas-injection pipeline and a micro-orifice flowmeter 21. The gas-liquid mixer 24 is provided at an upper end of the simulated wellbore 26. The pressure-disturbing device 25 is connected to a lower side of the gas-liquid mixer 24. A plurality of pressure sensors are provided at a middle of the simulated wellbore 26, and connected to the computer 35 through a wire and the oscilloscope 34. The gas-liquid separator 27 is connected to a lower end of the simulated wellbore 26, and a liquid outlet of the gas-liquid separator 27 is in pipeline connection with the liquid storage tank for recycling.

As shown in FIG. 3, the pressure-disturbing device includes a pressure wave generator 25.1, a pressure wave propagation unit 25.2, and a disturbance tube 25.3. The pressure wave generator 25.1 is provided with one or more pistons 25.4. A lower outlet of each of the one or more pistons 25.4 is connected to a collection chamber 25.8. An outlet end of the collection chamber 25.8 communicates with the pressure wave propagation unit 25.2. An outer wall of the disturbance tube 25.3 is provided with a plurality of openings. The plurality of openings are each provided with a rubber membrane 25.5. An outer end of the pressure wave propagation unit 25.2 is connected to the disturbance tube 25.3. The rubber membrane is configured to collect and concentrate pressure waves for propagation.

In this embodiment, the outer wall of the disturbance tube 25.3 is provided with three openings, evenly arranged opposite the outlet, the left side, and on the right side of the pressure wave propagation unit 25.2.

The pressure wave propagation unit 25.2 provided in the present disclosure is made of aluminum alloy. A first side of the pressure wave propagation unit 25.2 is a cylindrical structure, and a second side of the pressure wave propagation unit 25.2 is a spherical-like structure. An outer end of the spherical-like structure is connected to the disturbance tube 25.3. The rubber membrane 25.5 can be made of butadiene rubber, which effectively transmits pressure waves to the interior of the simulated wellbore 26, and is resilient, making it resistant to being soaked or damaged by liquid impacts. The rubber membrane 25.5 is provided in the opening to effectively collect and concentrate pressure waves for propagation.

Furthermore, the outer shell of the pressure wave generator 25.1 is provided with a heat dissipation and noise reduction plate 25.7 composed of graphite film and a sound-absorbing cotton made of polyester fiber. The high-performance graphite film has a thermal conductivity coefficient of 1500-1800 W/m·K, which can rapidly reduce the temperature at the location of the heat-generating element during the operation of the piston 25.4, ensuring a more uniform temperature distribution of the piston 25.4 and improving its stability and service life. The sound-absorbing cotton made of polyester fiber can effectively absorb the noise generated during operation to prevent interference with pressure waves monitoring caused by noise waves.

Further, the actuator 25.6 drives four pistons 25.4 to move simultaneously with different strokes and maintains a stable angular frequency of pressure waves generated by the pressure wave generator 25.1. The angular frequency of the pressure waves is controlled by adjusting the speed of the pistons 25.4. These pistons 25.4 can provide a continuous and stable pressure wave with an angular frequency ranging from 0 to 314 Hz. Additionally, the lower part of the piston 25.4 is tapered gradually, ensuring a noticeable change in the cross-section of the liquid flow within the piston 25.4. Compared to pistons with cylindrical shapes, this design of the present disclosure is more prone to causing pressure disturbances. Moreover, after generating pressure disturbances, the piston 25.4 propagates them to the disturbance tube 25.3 through the pressure wave propagation unit 25.2 made of aluminum alloy material. Among various alloys, aluminum alloy material effectively propagates pressure waves, prevents pressure wave dispersion and leakage, and is resistant to corrosion to its structure from water vapor. Based on the principle of biological ear absorption of sound waves, the spherical-like structure enhances the concentration of pressure wave propagation. This structure facilitates the concentration of pressure waves into the disturbance tube 25.3. When the pressure waves propagate to the disturbance tube 25.3, the pressure waves are first received and rebounded into the simulated wellbore 26 by the rubber membrane 25.5 on the outer wall of the disturbance tube 25.3. The rubber membrane 25.5 is provided in the opening structure to concentrate pressure waves and rebound them effectively. After rebounding through the rubber membrane 25.5, the pressure waves enter the simulated wellbore 26 and are detected by multiple pressure sensors along the path to observe their propagation pattern.

Specifically, a first regulating valve 6, a first ball valve 7, a first pressure measurement point 8 and a first temperature measurement point 9 are sequentially provided on the second liquid-injection pipeline. The number of the mass flowmeter is one or more, and one or more mass flowmeters 11 are provided on a first side of the first temperature measurement point 9. A first end of each of the one or more mass flowmeters is connected to a first micro-regulating valve, and a second end of each of the one or more mass flowmeters is connected to a second micro-regulating valve. The first regulating valve 6, the first ball valve 7, the first micro-regulating valve 10 and the second micro-regulating valve 12 are configured to be adjusted in terms of opening degree to control liquid flow and pressure input into the simulated wellbore. The top of the liquid storage tank 1 is connected to the liquid injection pipeline of the outlet end of the pressure-stabilizing water tank 4 through pipelines and the third regulating valve 5.

Specifically, a second regulating valve 16, a second ball valve 17, a second pressure measurement point 18 and a second temperature measurement point 19 are sequentially provided on the gas-injection pipeline. The number of the micro-orifice flowmeter is one or more, and one or more micro-orifice flowmeters are provided on a side of the second temperature measurement point 19 away from the gas storage tank. A third pressure measurement point 20 is provided on a first side of each of the one or more micro-orifice flowmeters; and a third micro-regulating valve 22 is provided on a second side of each of the one or more micro-orifice flowmeters. The second regulating valve, the second ball valve and the third micro-regulating valve are configured to be adjusted in terms of opening degree to adjust a void fraction and a pressure disturbance frequency, so as to simulate effects of different parameters on a propagation pattern of the pressure waves inside a wellbore.

The simulated wellbore 26 includes an outer pipe and an inner pipe, both made of transparent acrylic glass.

Additionally, the plurality of pressure sensors are arranged at intervals of 0.5 m on an outer side of the simulated wellbore 26, and the plurality of pressure sensors are connected to the oscilloscope 34 through an optical fiber to transmit a pressure signal to the oscilloscope 34. Among them, the pressure sensors include a first pressure sensor 28, a second pressure sensor 29, a third pressure sensor 30, a fourth pressure sensor 31, a fifth pressure sensor 32, and a sixth pressure sensor 33. The second pressure sensor 29, the third pressure sensor 30, the fourth pressure sensor 31, and the fifth pressure sensor 32 are arranged on the outer side of the simulated wellbore 26 at intervals of 0.5 meters, with the first pressure sensor 28 located on the other side of the second pressure sensor 29. The pressure-disturbing device 25 is provided with the sixth pressure sensor 33.

An expansion tube 36 is provided at the lower end of the simulated wellbore 26. The expansion tube 36 is configured to eliminate reflection of the pressure waves to improve the measurement accuracy of the pressure signal.

A gas intrusion early monitoring method based on the device is also provided by the present disclosure, including the following steps.

(S1) A shut-off valve 2 on the first liquid-injection pipeline is opened, and the centrifugal pump to pressurize water is turned on, such that the first liquid-injection pipeline is filled with water.

The water is allowed to flow sequentially through the first regulating valve 6, the first ball valve 7, the first pressure measurement point 8, the first temperature measurement point 9, the first micro-regulating valve 10, the mass flowmeter 11, the second micro-regulating valve 12, and a first check valve 13 into the liquid inlet of the gas-liquid mixer 24.

The water is allowed to flow through an outlet of the gas-liquid mixer 24 to enter the simulated wellbore 26 to flow downwards along the inner pipe; where the plurality of pressure sensors are arranged at intervals of 0.5 m on the outer side of the simulated wellbore 26, and connected to the oscilloscope 34 through the optical fiber to transmit the pressure signal to the oscilloscope 34 and the computer 35.

(S2) After a flow pattern in the second liquid-injection pipeline and a pressure reading on the computer 35 tends to be stable, the screw air compressor 14 is turned on, and the gas storage tank 15 connected to the screw air compressor 14, and the second regulating valve 16 are opened, such that gas flows sequentially through the second regulating valve 16, the second ball valve 17, the second pressure measurement point 18 and the second temperature measurement point 19 on the gas-injection pipeline.

A pressure of the gas to be larger than a pressure within the second liquid-injection pipeline is adjusted by the one or more micro-orifice flowmeters.

The gas is allowed to enter the gas-liquid mixer 24 through the gas inlet and flow into the inner pipe of the simulated wellbore 26 to simulate gas intrusion.

An opening degree of the second ball valve 17 is adjusted to change a void fraction of a fluid within the simulated wellbore 26, so as to simulate the gas intrusion under various formation conditions.

(S3) Pressure changes from the computer 35 is read and readings of the mass flowmeter 11 and the one or more micro-orifice flowmeters 21 are obtained.

The water is allowed to flow through the expansion tube 36 to eliminate a reflection of the pressure waves and flow downward to the gas-liquid separator 27

The water is separated from the gas and ascends through an annulus formed between the outer pipe and the inner pipe and exits through an outlet of the annulus at a top of the simulated wellbore 26 to enter the liquid storage tank 1 for recycling.

The gas separated by the gas-liquid separator 27 is directly discharged.

(S4) A disturbance angular frequency of the pressure-disturbing device 25 is adjusted to simulate an effect of different parameters of the wellbore on a propagation pattern of the pressure waves in a wellbore, where the disturbance angular frequency is continuously adjustable within 0-314 Hz.

A pressure fluctuation inside the simulated wellbore 26 is monitored to obtain a critical parameter associated with an abnormal pressure fluctuation signal when the simulated wellbore 26 experiences gas intrusion, which provides a theoretical basis for an early detection and control of the gas intrusion to ensure safety of a drilling operation.

(S5) A viscosity of the water in the liquid storage tank is altered and repeating steps S1-S4 to simulate a condition of gas intrusion under different viscosity conditions of a drilling fluid, so as to provide a reference basis for investigation of the two-phase flow pattern and a two-phase pressure propagation pattern under the occurrence of an actual gas intrusion.

The foregoing description only represents some preferred embodiments of the present disclosure. It will be apparent to those skilled in the art that various modifications or equivalent replacements may be made to the described technical solutions. Therefore, it should be understood that those changes, modifications and replacements made without departing from the spirit of the disclosure shall fall within the scope of the disclosure defined by the appended claims.

What is claimed is:

1. A device for early monitoring of gas intrusion based on pressure wave propagation, comprising:
   a liquid storage tank;

a gas storage tank;
a simulated wellbore;
a computer;
a centrifugal pump;
a pressure-stabilizing water tank;
a mass flowmeter;
a screw air compressor;
a micro-orifice flowmeter;
a gas-liquid mixer;
a pressure-disturbing device;
a gas-liquid separator; and
an oscilloscope;
wherein a lower end of the liquid storage tank is connected to an inlet end of the pressure-stabilizing water tank through a first liquid-injection pipeline and the centrifugal pump;
an outlet end of the pressure-stabilizing water tank is connected to a liquid inlet of the gas-liquid mixer through a second liquid-injection pipeline and the mass flowmeter;
a first end of the gas storage tank is connected to the screw air compressor and a second end of the gas storage tank is connected to a gas inlet of the gas-liquid mixer through a gas-injection pipeline and the micro-orifice flowmeter;
the gas-liquid mixer is provided at an upper end of the simulated wellbore;
the pressure-disturbing device is connected to a lower side of the gas-liquid mixer;
a plurality of pressure sensors are provided at a middle of the simulated wellbore, and connected to the computer through a wire and the oscilloscope;
the gas-liquid separator is connected to a lower end of the simulated wellbore, and a liquid outlet of the gas-liquid separator is in pipeline connection with the liquid storage tank for recycling; and
the pressure-disturbing device comprises:
a pressure wave generator;
a pressure wave propagation unit; and
a disturbance tube;
wherein the pressure wave generator is provided with one or more pistons;
a lower outlet of each of the one or more pistons is connected to a collection chamber;
an outlet end of the collection chamber communicates with the pressure wave propagation unit;
an outer wall of the disturbance tube is provided with a plurality of openings;
the plurality of openings are each provided with a rubber membrane;
an outer end of the pressure wave propagation unit is connected to the disturbance tube; and
the rubber membrane is configured to collect and concentrate pressure waves for propagation.

2. The device of claim 1, wherein a first side of the pressure wave propagation unit is a cylindrical structure, and a second side of the pressure wave propagation unit is a spherical-like structure; and
an outer end of the spherical-like structure is connected to the disturbance tube.

3. The device of claim 2, wherein a first regulating valve, a first ball valve, a first pressure measurement point and a first temperature measurement point are sequentially provided on the second liquid-injection pipeline;
the number of the mass flowmeter is one or more, and one or more mass flowmeters are provided on a first side of the first temperature measurement point;
a first end of each of the one or more mass flowmeters is connected to a first micro-regulating valve, and a second end of each of the one or more mass flowmeters is connected to a second micro-regulating valve; and
the first regulating valve, the first ball valve, the first micro-regulating valve and the second micro-regulating valve are configured to be adjusted in terms of opening degree to control liquid flow and pressure input into the simulated wellbore.

4. The device of claim 3, wherein a second regulating valve, a second ball valve, a second pressure measurement point and a second temperature measurement point are sequentially provided on the gas-injection pipeline;
the number of the micro-orifice flowmeter is one or more, and one or more micro-orifice flowmeters are provided on a side of the second temperature measurement point away from the gas storage tank;
a third pressure measurement point is provided on a first side of each of the one or more micro-orifice flowmeters; and a third micro-regulating valve is provided on a second side of each of the one or more micro-orifice flowmeters; and
the second regulating valve, the second ball valve and the third micro-regulating valve are configured to be adjusted in terms of opening degree to adjust a void fraction and a pressure disturbance frequency, so as to simulate effects of different parameters on a propagation pattern of the pressure waves inside a wellbore.

5. The device of claim 4, wherein the simulated wellbore comprises an outer pipe and an inner pipe; and
the outer pipe and the inner pipe are both made of a transparent acrylic glass.

6. The device of claim 5, wherein the plurality of pressure sensors are arranged at intervals of 0.5 m on an outer side of the simulated wellbore; and
the plurality of pressure sensors are connected to the oscilloscope through an optical fiber to transmit a pressure signal to the oscilloscope.

7. The device of claim 6, wherein an angular frequency of the pressure waves generated by the pressure-disturbing device ranges from 0 to 314 Hz.

8. The device of claim 7, wherein an expansion tube is provided at the lower end of the simulated wellbore; and
the expansion tube is configured to eliminate reflection of the pressure waves.

9. A method for early monitoring of gas intrusion based on the device of claim 8, comprising:
(S1) opening a shut-off valve on the first liquid-injection pipeline, and turning on the centrifugal pump to pressurize water, such that the first liquid-injection pipeline is filled with water;
allowing the water to flow sequentially through the first regulating valve, the first ball valve, the first pressure measurement point, the first temperature measurement point, the first micro-regulating valve, the mass flowmeter, the second micro-regulating valve, and a check valve into the liquid inlet of the gas-liquid mixer; and
allowing the water to flow through an outlet of the gas-liquid mixer to enter the simulated wellbore to flow downwards along the inner pipe; wherein the plurality of pressure sensors are arranged at intervals of 0.5 m on the outer side of the simulated wellbore, and connected to the oscilloscope through the optical fiber to transmit the pressure signal to the oscilloscope and the computer;

(S2) after a flow pattern in the second liquid-injection pipeline and a pressure reading on the computer tends to be stable, turning on the screw air compressor, and opening the gas storage tank connected to the screw air compressor, and the second regulating valve, such that gas flows sequentially through the second regulating valve, the second ball valve, the second pressure measurement point and the second temperature measurement point on the gas-injection pipeline;

adjusting, by the one or more micro-orifice flowmeters, a pressure of the gas to be larger than a pressure within the second liquid-injection pipeline;

allowing the gas to enter the gas-liquid mixer through the gas inlet and flow into the inner pipe of the simulated wellbore to simulate gas intrusion; and adjusting an opening degree of the second ball valve to change a void fraction of a fluid within the simulated wellbore, so as to simulate the gas intrusion under various formation conditions;

(S3) reading pressure changes from the computer and obtaining readings of the mass flowmeter and the one or more micro-orifice flowmeters;

reading pressures from the plurality of pressure sensors, the first pressure measurement point and the second pressure measurement point based on the oscilloscope and the computer to analyze a two-phase flow pattern in the simulated wellbore under different void fractions and a pressure propagation pattern when a gas intrusion occurs;

allowing the water to flow through the expansion tube to eliminate a reflection of the pressure waves and flow downward to the gas-liquid separator;

wherein the water is separated from the gas and ascends through an annulus formed between the outer pipe and the inner pipe and exits through an outlet of the annulus at a top of the simulated wellbore to enter the liquid storage tank for recycling;

the gas separated by the gas-liquid separator is directly discharged;

(S4) adjusting a disturbance angular frequency of the pressure-disturbing device to simulate an effect of different parameters of the wellbore on a propagation pattern of the pressure waves in a wellbore, wherein the disturbance angular frequency is continuously adjustable within 0-314 Hz;

monitoring a pressure fluctuation inside the simulated wellbore to obtain a critical parameter associated with an abnormal pressure fluctuation signal when the simulated wellbore experiences gas intrusion; and (S5) altering a viscosity of the water in the liquid storage tank and repeating steps S1-S4 to simulate a condition of gas intrusion under different viscosity conditions of a drilling fluid.

* * * * *